United States Patent [19]

Usami

[11] Patent Number: 5,745,411
[45] Date of Patent: Apr. 28, 1998

[54] SEMICONDUCTOR MEMORY DEVICE

[75] Inventor: Tadashi Usami, Hino, Japan

[73] Assignee: Motorola, Inc., Schaumburg, Ill.

[21] Appl. No.: 570,169

[22] Filed: Dec. 7, 1995

[30] Foreign Application Priority Data

Dec. 8, 1994 [JP] Japan ................. 6-331509

[51] Int. Cl.$^6$ ................. G11C 11/34
[52] U.S. Cl. ................. 365/185.09; 365/185.18; 365/185.22
[58] Field of Search ................. 365/189.09, 185.18, 365/185.22, 201, 185.04, 185.24, 185.29

[56] References Cited

U.S. PATENT DOCUMENTS 4,958,324  9/1990  Devin ................. 365/201
5,007,026  4/1991  Gaultier et al. ................. 365/201

*Primary Examiner*—David C. Nelms
*Assistant Examiner*—F. Niranjan
*Attorney, Agent, or Firm*—Rennie William Dover; Harry A. Wolin

[57] ABSTRACT

A semiconductor memory device that permits the threshold voltage Vth of a cell transistor to be measured easily and inexpensively is provided. A semiconductor memory device 1 is provided, which has a plurality of cell transistors C for storing predetermined data and is operative at a preset operating voltage Vdd, wherein during normal operation, said operating voltage Vdd is applied between a control gate and a source of each of said cell transistor C, and wherein during testing operation, a test voltage Vcc which is at lower potential than the operating voltage Vdd is applied between the control gate and source of each of said cell transistors C independently of the operating voltage Vdd.

4 Claims, 4 Drawing Sheets

SEMICONDUCTOR MEMORY DEVICE

FIELD OF THE INVENTION

The present invention relates to semiconductor memory devices, and more specifically, to a semiconductor memory device suitable for use in EPROM (Erasable Programmable Read Only Memory), EEPROM (Electrically Erasable Programmable Read Only Memory), flash-type EEPROM (hereinafter referred to simply as flash memory), and other semiconductor memories, where a threshold voltage Vth of a cell transistor can be measured and tested.

BACKGROUND OF THE INVENTION

With the increasing proliferation of information processing systems and equipment, such as computers and word processors, numerous types of non-volatile semiconductor memories, such as EPROM, EEPROM, and flash memories, that are user-programmable and rewritable by erasing the data written therein; especially, ultraviolet-erasing type EPROM has been extensively used as a nonvolatile semiconductor memory for use in information processing systems due to the demand for reduced time of delivery to users.

This is because there is a high probability that faults such as bugs in the hardware itself or bugs in software portions built into the EPROM occur with computers and word processors before their shipment; thus, such EPROMs facilitate simple reuse or modification of software portions by externally irradiating ultraviolet rays through a window provided on the package and allowing electrons in the floating gate to escape into the silicon substrate, thereby placing it in a state before it was written.

However, EPROMs packaged with a window for ultraviolet irradiation involve high production costs, so they are relatively expensive, with sizes slightly larger than typical mask ROMs.

Thus, in cases where inexpensive, small PROMs are demanded, OTP-EPROMs (One Time Programmable Read Only Memory) are used that can be written once as the window for ultraviolet irradiation is removed.

Conventionally, EPROMs and EEPROMs, for example, are known as non-volatile memories that become rewritable by erasing certain data that has been written.

FIGS. 3A and 3B is an illustration for explaining how data is written to and erased from a cell transistor C of an EPROM.

In FIG. 3A, reference symbols CG, FG, D, S, Id and VGS denote a control gate electrode, a floating gate electrode, an N+ drain electrode, an N+source electrode, a current flowing between the drain and source, and a voltage applied between the control gate and source, respectively.

First, to write data to the cell transistor C, a high-potential voltage Vpp is applied to the control gate CG and drain D, and avalanche injection near the drain D causes electrons to be injected into the floating gate FG, thereby cutting off the cell transistor C. This causes the threshold voltage Vth of the cell transistor C during the write to rise gradually, as shown in FIG. 3B, eventually reaching about 6.5–8V (about 7V in this case).

To erase written data from the cell transistor C, electrons are removed from the floating gate FG by irradiating it with ultraviolet rays, thereby erasing the written data. This causes the threshold voltage Vth of the memory cell during the erasure to fall gradually, as shown in FIG. 3B, eventually reaching about 1–2V (about 1.6V in this case).

As described above, the threshold voltage Vth of the cell transistor C which was written and erased is, ideally, either in a high-potential state of about 6.5–8V or in a low-potential state of about 1–2V; so the data in the cell transistor C is stored either in a write state ("H") when the threshold voltage Vth of the memory cell is higher than a predetermined read-out voltage VGS applied between the control gate and source (in this case, VGS is a device operating voltage, or 5V), or in an erase state ("L") when the threshold voltage Vth is lower.

In this case, testing to determine whether each cell transistor C has been programmed properly is performed by measuring the threshold voltage Vth of each cell transistor C.

More specifically, as shown in FIG. 4, by applying the operating voltage Vdd (in this case, Vdd=5V) of the cell transistor C to the drain electrode of the cell transistor C via resistor R, and also providing a sense amplifier on the drain electrode and applying any read-out voltage VGS between the control gate and source of the cell transistor C, the threshold voltage Vth of the current cell transistor C is measured, depending on whether or not the current Id flowing between the drain and source due to the read-out voltage VGS is detected by the sense amplifier.

As shown in FIG. 5, a flow of manufacturing steps for a conventional semiconductor memory device consists of (1) wafer process, (2) probe test (read/write), (3) erasure, (4) assembly, (5) finished product test (read/write), (6) erasure, and (7) shipment; and for the afore-described OTP version, the flow consists of the same steps (1)–(4), and step (5)' finished product test (only read) and (7)' shipment, with step (3) erasure after assembly omitted due to the nature of OTP.

Now, if ultraviolet erasure (3) after probe test (2) is insufficient, or if charges are accumulated on the floating gate due to some cause during assembly (4) after ultraviolet erasure (3), or if data is written weakly or erroneously during finished product test (5) or (5)', then it is conceivable that the threshold voltage Vth of the erasure cell may rise above 1–2V; however, because the conventional read-out voltage VGS is equivalent to the device operating voltage or 5V, and also because a margin for the threshold voltage Vth on the low-potential side, i.e., (5V–(1–2V)=(3–4V)), is sufficiently large as compared to a margin for the threshold voltage Vth on the high-potential side, i.e., (6.5–8V)–5V=(1.5–3V)), the threshold voltage Vth on the low-potential side, that is, the threshold voltage corresponding to the erasure cell, is not tested.

However, recent trends indicate that the threshold voltage for semiconductor devices is decreasing down to a range of 3–3.3V from the typical 5V operation. With such decreasing trends in the operating voltage of the semiconductor devices in mind, assume that the device operates at 3V. Then, the read-out voltage VGS is equal to the device operating voltage of 3V, so the margin for the threshold voltage Vth on the low-potential side, (3V–(1–2V)=(1–2V)) is extremely reduced as compared to the margin for the threshold voltage on the high-potential side, (6.5–8V)–3V=(3.5–5V)). So, if the threshold voltage of the erasure cell exceeds the read-out voltage VGS due to a rise in the threshold voltage Vth of the erasure cell, that cell transistor C is placed in a write state, resulting in a program error. Especially, with the OTP version, unlike the window-equipped package, because the final erasure step (6) is not performed, the problem of an increasing threshold voltage Vth for the erasure cell is further complicated.

For that reason, the threshold voltage Vth might be tested on the erasure cell by lowering the read-out voltage VGS. Although it may be somewhat checked by lowering the read-out voltage, another new problem arises in that because the operation of the peripheral circuitry stops as the voltage is lowered, a dedicated circuit is required to conduct tests below the operating voltage of the peripheral circuitry, thus resulting in increased costs.

SUMMARY OF THE INVENTION

Accordingly, it is an object of the present invention to provide a semiconductor memory device that permits the cell transistor threshold voltage Vth to be measured easily and cost-effectively.

The invention
- a semiconductor memory device 1, having a plurality of cell transistors C for storing predetermined data, said semiconductor memory device operative at a preset operating voltage Vdd,
- wherein during normal operation, said operating voltage Vdd (=VH−VL1) is applied between a control gate and a source of each of said cell transistors C, and wherein during testing operation, a test voltage Vcc (=VH−VL2), which is at a lower potential than said operating voltage Vdd, is applied between the control gate and source of each of said cell transistors, independently of the operating voltage Vdd.

The invention comprises 1A
- a semiconductor memory device 1, having a plurality of cell transistors C for storing predetermined data corresponding to intersections between a plurality of bit lines BL and a plurality of word lines WL, said semiconductor memory device operative at a preset operating voltage Vdd,
- wherein a high-potential voltage VH, which is at the same potential as said operating voltage Vdd, is applied to a control gate CG of each of said cell transistors C, and wherein either a first low-potential voltage VL1, which is a ground potential GND, or a second low-potential voltage VL2, which is at a higher potential than the first low-potential voltage VL1, is selectively applied to a source electrode S of each of said cell transistors C, depending on the operating status.

The invention comprises
- a semiconductor memory device, having a plurality of cell transistors C for storing predetermined data corresponding to intersections between a plurality of bit lines BL and a plurality of word lines WL, said semiconductor memory device operative at a preset operating voltage Vdd,
- wherein a low-potential voltage VL, which is a ground potential GND, is applied to a source electrode S of each of said cell transistors C, and wherein either a first high-potential voltage VH1, which is at the same potential as said operating voltage Vdd, or a second high-potential voltage VH2, which is independent of the operating voltage Vdd and at a lower potential than the first high-potential voltage VH1, is selectively applied to a control gate CG of each of said cell transistors C, depending on the operating status.

The invention comprises
- a semiconductor memory device wherein said plurality of cell transistors C comprise an EPROM encapsulated in an OTP package.

According to the invention during normal operation, the operating voltage Vdd is applied between the control gate and source of each cell transistor, whereas during testing operation, a test voltage Vcc, which is at a lower potential than said operating voltage Vdd, is applied between the control gate and source of each cell transistor, independently of the operating voltage Vdd, so that the cell transistor threshold voltage Vth can be measured easily and cost-effectively, without affecting the operation of the peripheral circuitry during testing operation.

According to the invention, a high-potential voltage VH equivalent in potential to the operating voltage Vdd is applied to the control gate electrode of each cell transistor, and either a first low-potential voltage VL1, which is a ground potential, or a second low-potential voltage VL2, which is at a higher potential than the first low-potential voltage VL1, is selectively applied to the source electrode of each cell transistor depending on the operating status, so that the read-out voltage to be applied between the control gate and source of each cell transistor can be reduced without affecting the operation of the peripheral circuitry during the test operation, thereby permitting easy and cost-effective measurement of the cell transistor threshold voltage Vth.

According to the invention, a low-potential voltage VL, which is a ground potential, is applied to the source electrode of each cell transistor, and either a first high-potential voltage VH1 equivalent in potential to the operating voltage Vdd, or a second high-potential voltage VH2, which is independent of the operating voltage Vdd and at a lower potential than the first high-potential voltage VH1, is selectively applied to the control gate electrode of each cell transistor depending on the operating status, so that the read-out voltage to be applied between the control gate and source of each cell transistor can be reduced without affecting the operation of the peripheral circuitry during the test operation, thereby permitting easy and cost-effective measurement of the cell transistor threshold voltage Vth.

According to the invention when applied to an EPROM encapsulated in an OTP package, a product with high reliability achievable with measurement of the erasure cell threshold voltage Vth can be provided, in addition to the invention according to claim 1, 2, or 3 described above.

DETAILED DESCRIPTION OF THE PREFERRED EMBODIMENT

Figure 1A:
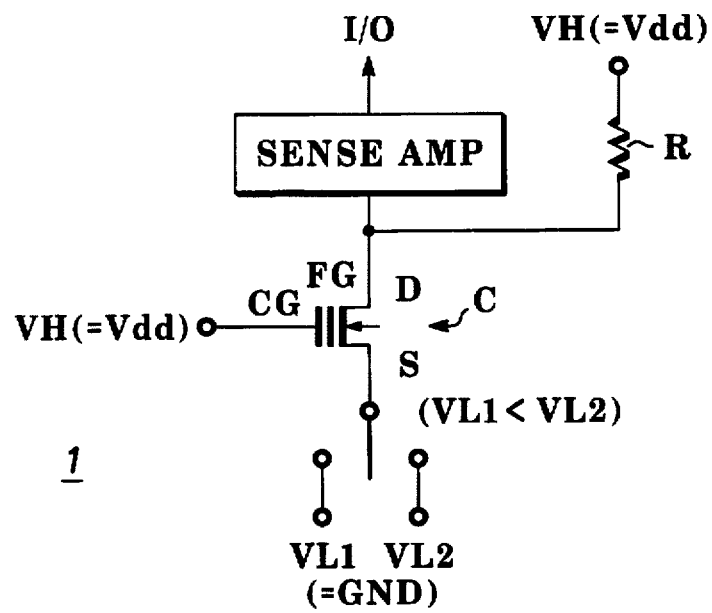
FIGS. 1A and 1B is a principle diagram of a semiconductor memory device according to the present invention.
Figure 1B:
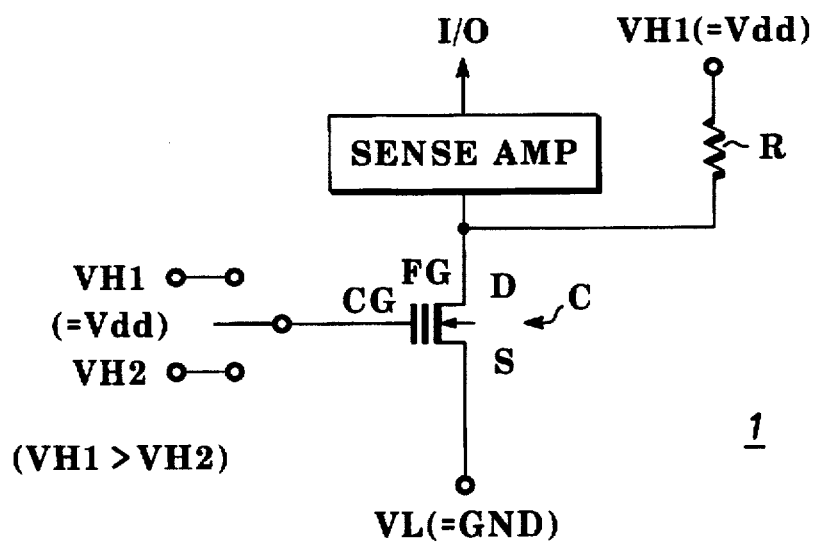
Figure 2:
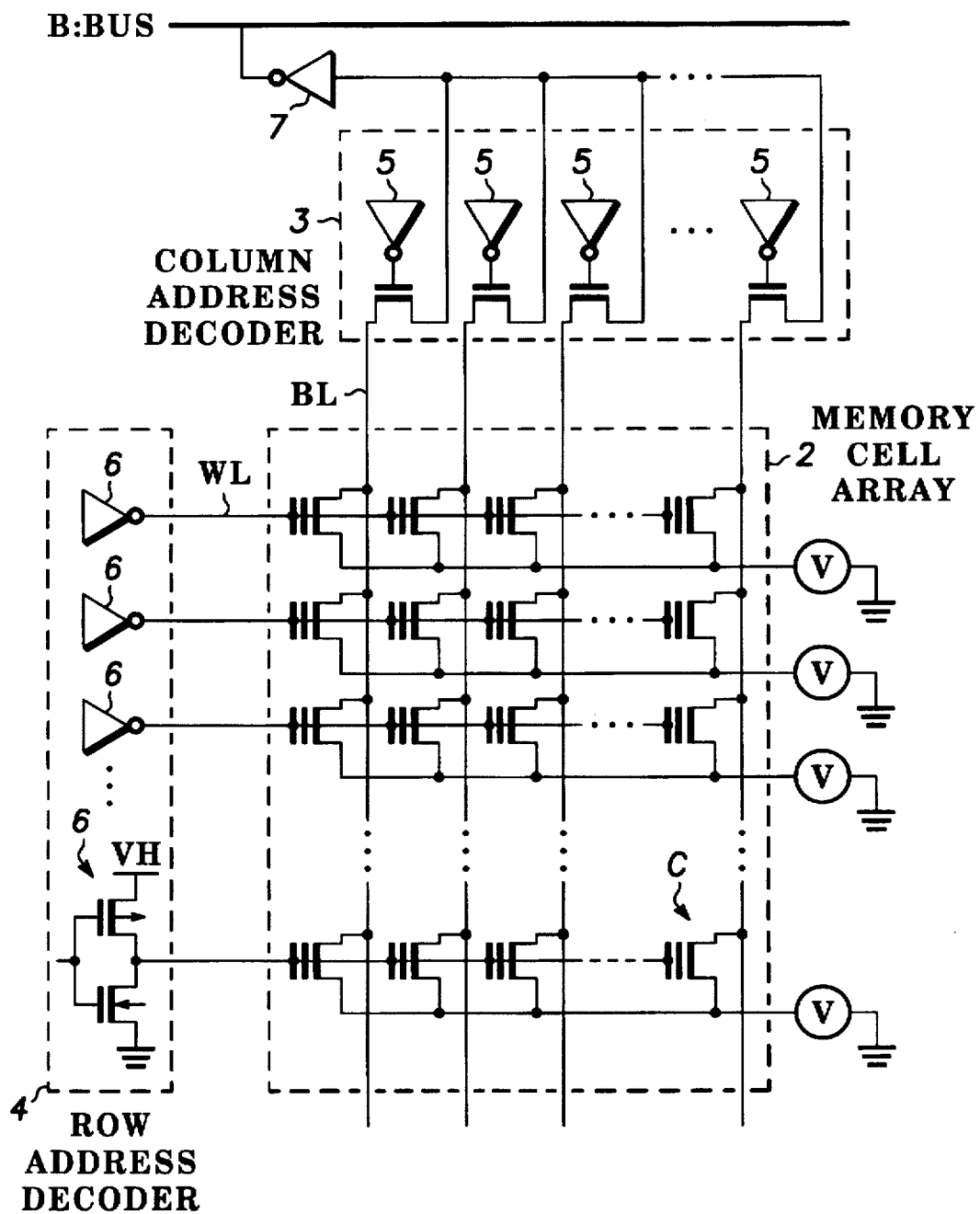
FIG. 2 is a circuit diagram depicting principal components of the semiconductor memory device according to the present embodiment of the invention.
Figure 3A:
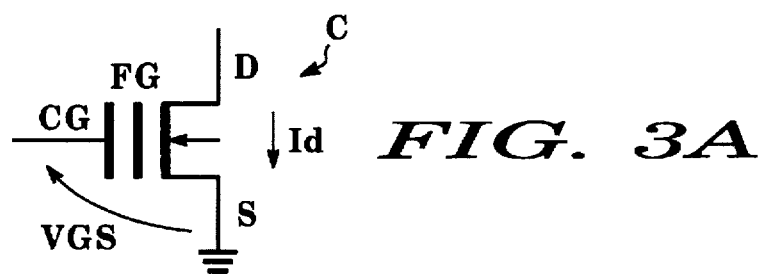
FIGS. 3A–3B is a diagram for explaining how data is written to and erased from the cell transistor of the EPROM.
Figure 3B:
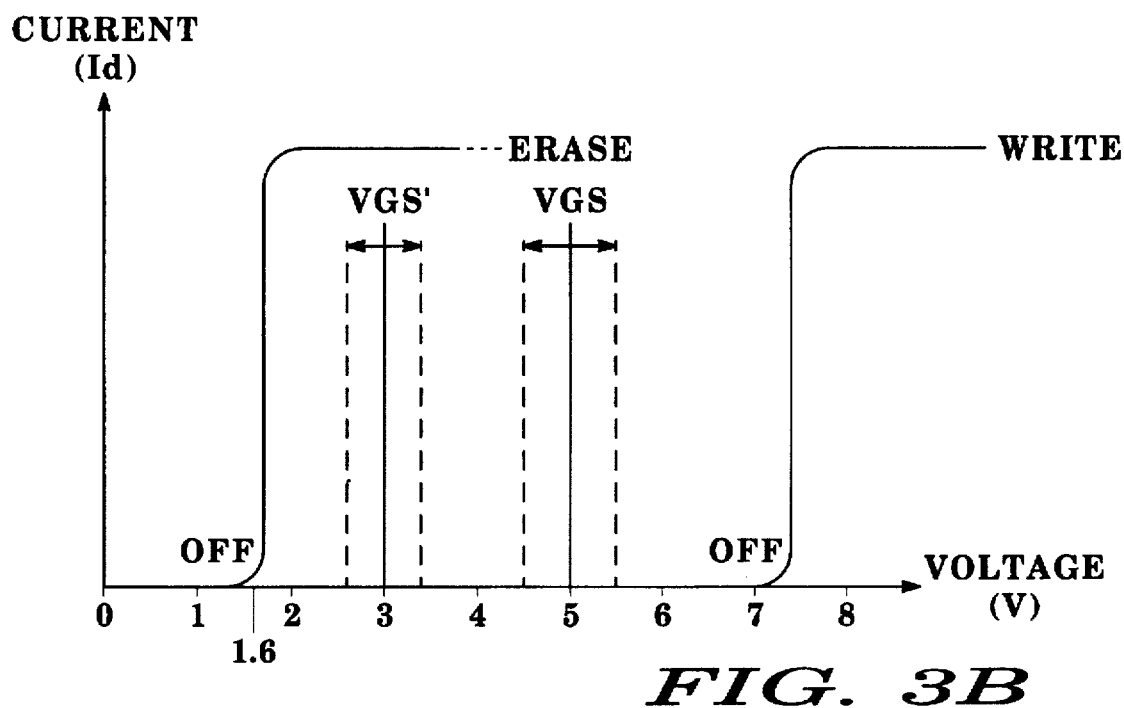
Figure 4:
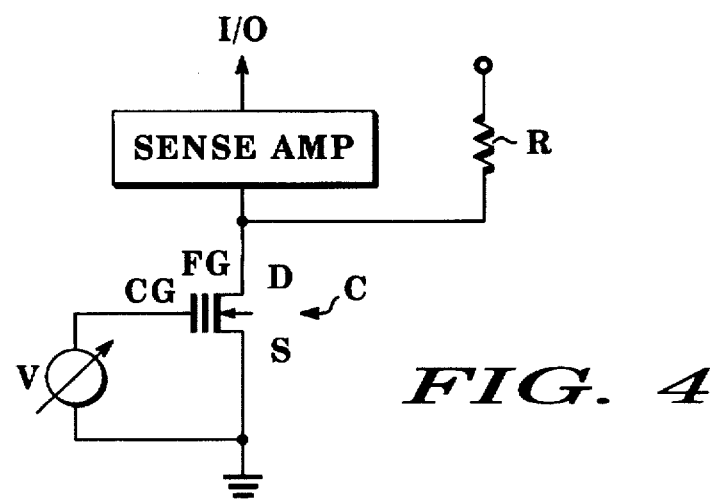
FIG. 4 is a diagram for explaining how a threshold voltage of the cell transistor is measured.
Figure 5:
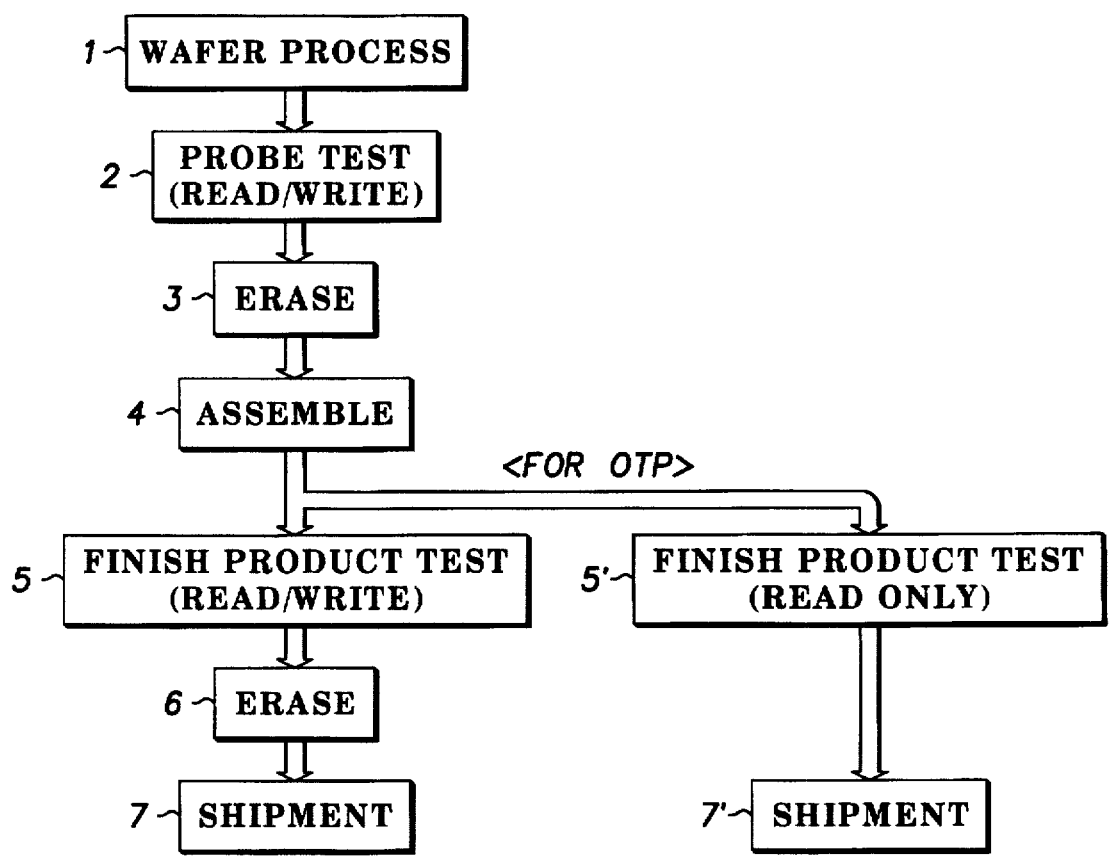
FIG. 5 is a diagram depicting an EPROM fabrication process.

A preferred embodiment of the present invention will be described below with reference to FIG. 2. In FIG. 2, like reference symbols denote similar parts of FIGS. 1A and 1B.

First, the structure of the preferred embodiment is described.

FIG. 2 is a circuit diagram depicting principal components of the semiconductor memory device 1 according to the present embodiment. In FIG. 2, the semiconductor memory device 1 of the present embodiment consists mainly of a memory cell array 2, which comprises a group of multiple cell transistors C, and a column address decoder 3 and a row address decoder 4 for selecting a certain cell transistor C from the memory cell array 2 according to predetermined address information.

It should be noted that reference numerals 5, 6 and 7 denote an inverter in the column address decoder 3, a row address decoder, and a buffer amplifier, respectively.

Each cell transistor C in the memory cell array 2 connects a drain electrode D to a signal line from the column address decoder 3, and connects a control gate electrode CG to a signal line from the row address decoder 4, and connects source electrodes S in common so that a voltage of a predetermined potential is applied thereto.

Next, the operation of the above embodiment is described with reference to FIGS. 1A and 2.

Assuming that the operating voltage Vdd of the semiconductor memory device 1 is 5V, then select voltage VH outputted from the column address decoder 3 and row address decoder 4 is also the same as the operating voltage at 5V.

During normal operation, since a first low-potential voltage VL1 applied to the source electrode S is a ground potential GND (=0V), the read-out voltage VGS is then 5V (=5V–0V).

On the other hand, during testing operation, since a second low-potential voltage VL2 applied to the source electrode S is higher in potential than the ground potential GND, the read-out voltage VGS is then lower than 5V, so that the erasure cell threshold voltage Vth may be measured easily by adjusting the voltage value of the second low-potential voltage VL2.

In this case, the operation of the peripheral circuitry will not be affected at all during the testing operation, because the operating voltage Vdd is supplied to the peripheral circuitry.

As described above, a high-potential voltage VH equivalent in potential to the operating voltage Vdd is applied to the control gate electrode CG of each cell transistor, and either a first low-potential voltage VL1, which is the ground potential GND, or a second low-potential voltage VL2, which is higher in potential than the first low-potential voltage VL1, is selectively applied to the source electrode S of each cell transistor depending on the operating status, so that the read-out voltage to be applied between the control gate and source of each cell transistor can be reduced to measure the cell transistor threshold voltage Vth easily and cost-effectively, without affecting the operation of the peripheral circuitry during the testing operation.

Next, another embodiment will be described with reference to FIGS. 1B and 2.

In the previous embodiment, the voltage applied to the source electrode S of each cell transistor during the testing operation, that is, the low-potential voltage, is raised above that of normal operation, thereby reducing the read-out voltage applied between the control gate and source of the cell transistor C. In the present embodiment, however, the voltage applied to the control gate electrode CG of the cell transistor C during the testing operation, that is, a high-potential voltage, is lowered below that of normal operation, thereby reducing the read-out voltage applied between the control gate and source of the cell transistor C.

More specifically, as shown in FIG. 2, a high-potential voltage VH (=Vdd) of the inverter 6 comprised of P-channel and N-channel MOS transistors is selectively switched depending on the operating mode between a first high-potential voltage VH1 equivalent in potential to the operating voltage Vdd and a second high-potential voltage VH2, which is at a lower potential than the first high-potential voltage VH1, so that the read-out voltage VGS is equal to 5V (=5V–0V) because the first high-potential voltage VH1 applied to the control gate electrode CG during normal operation is equivalent to the operating voltage Vdd (=5V).

On the other hand, because the second high-potential voltage VH2 applied to the control gate CG during the testing operation is lower in potential than the operating voltage Vdd, the read-out voltage VGS is then lower than 5V, so that the erasure cell threshold voltage Vth may be measured easily by adjusting the voltage value of the second high-potential voltage VH2.

In this case, the operation of the peripheral circuitry will not be affected at all during the testing operation, because the operating voltage Vdd is supplied to the peripheral circuitry.

As described above, in the present embodiment, a low-potential voltage VL which is the ground potential GND is applied to the source electrode S of each cell transistor C, and either a first high-potential voltage VH1 equivalent in potential to the operating voltage Vdd or a second high-potential voltage, which is independent of the operating voltage Vdd and lower in potential than the first high-potential voltage VH1, is selectively applied to the control gate electrode CG of each cell transistor depending on the operating status, so that the read-out voltage to be applied between the control gate and source of each cell transistor can be reduced to measure the cell transistor threshold voltage Vth easily and cost-effectively, without affecting the operation of the peripheral circuitry during the testing operation.

The present invention has been described above with reference to preferred embodiments of the invention. However, those skilled in the art will appreciate that the present invention will not be limited to the above embodiments, and various changes and modifications may be made without departing from the scope of the present invention.

For example, in the above embodiments, a voltage applied to the source electrode S of a cell transistor C and a voltage applied to the control gate electrode CG of the cell transistor C are selected from two types of voltage values. However, because one of the voltage values is arbitrary in this case, an optimal value may be selected from a plurality of fixed voltage values.

Furthermore, the source electrode S of the cell transistor C and the high-potential voltage supply terminal of the inverter 6 may be assigned directly to external pins of the package that forms the semiconductor memory device 1, wherein testing operation can be performed easily by merely changing the voltage applied to such external pins, without adding extra components into the semiconductor memory device 1.

In addition, although the invention made by the inventor has been mainly described as applied to a semiconductor memory device which has been described in the field of the invention as its background, it is not limited thereto.

For example, it may be applicable to the measurement of the threshold voltage Vth of not only a memory cell, but also a transistor in a transistor-based semiconductor device. In this case, by regularly measuring changes in the threshold voltage Vth of the transistor after shipment, changes in the threshold voltage vth associated with the effects of hot electrons and so on can be measured, thereby assisting in maintaining the product quality that involves changes over time.

In the invention during normal operation, the operating voltage Vdd is applied between the control and source of each cell transistor, and during testing operation, a test voltage Vcc lower in potential than the operating voltage Vdd is applied between the control gate and source of each cell transistor independently of the operating voltage Vdd, thereby permitting the cell transistor threshold voltage Vth to be measured easily and cost-effectively, without affecting the operation of the peripheral circuitry during the test operation.

In the invention a high-potential voltage VH equivalent in potential to the operating voltage Vdd is applied to the control gate electrode of each cell transistor, and either a first low-potential voltage VL1, which is a ground potential, or a second low-potential voltage VL2, which is higher in potential than the first low-potential voltage VL1, is selectively applied to the source electrode of each cell transistor depending on the operating status, so that the read-out voltage to be applied between the control gate and source of each cell transistor can be reduced to measure the cell transistor threshold voltage Vth easily and cost-effectively, without affecting the operation of the peripheral circuitry during the test operation.

In the invention, a low-potential voltage VL, which is a ground potential, is applied to the source electrode of each cell transistor, and either a first high-potential voltage VH1 which is equivalent in potential to the operating voltage Vdd, or a second high-potential voltage VH2, which is independent of the operating voltage and lower in potential than the first high-potential voltage VH1, is selectively applied to the control gate electrode of each cell transistor depending on the operating status, so that the read-out voltage to be applied between the control gate and source of each cell transistor can be reduced to measure the cell transistor threshold voltage Vth easily and cost-effectively, without affecting the operation of the peripheral circuitry during the test operation.

In the invention when applied to an EPROM encapsulated in an OTP package, a product with high reliability achievable with measurement of an erasure cell threshold voltage Vth can be provided, in addition to the invention described in claims 1, 2, or 3.

What is claimed is:

1. A semiconductor memory device, having a plurality of cell transistors for storing predetermined data corresponding to intersections between a plurality of bit lines and a plurality of word lines, said semiconductor memory device operative at a preset operating voltage Vdd, wherein a high-potential voltage VH, which is at the same potential as said operating voltage Vdd, is applied to a control gate electrode of each of said cell transistors, and wherein either a first low-potential voltage VL1, which is a ground potential, or a second low-potential voltage VL2, which is at a higher potential than the first low-potential voltage VL1, is selectively applied to a source electrode of each of said cell transistors depending on the operating status.

2. A semiconductor memory device according to claim 1, wherein said plurality of cell transistors comprise an EPROM encapsulated in an OTP package.

3. A semiconductor memory device, having a plurality of cell transistors for storing predetermined data corresponding to intersections between a plurality of bit lines and a plurality of word lines, said semiconductor memory device operative at a preset operating voltage Vdd, wherein a low-potential voltage VL, which is a ground potential, is applied to a source electrode of each of said cell transistors, and wherein either a first high-potential voltage VH1, which is at the same potential as said operating voltage Vdd, or a second high-potential voltage VH2, which is independent of the operating voltage Vdd and at a lower potential than the first high-potential voltage VH1, is selectively applied to a control gate of each of said cell transistors depending on the operating status.

4. A semiconductor memory device according to claim 3, wherein said plurality of cell transistors comprise an EPROM encapsulated in an OTP package.

* * * * *